(12) United States Patent
Li et al.

(10) Patent No.: US 11,404,676 B2
(45) Date of Patent: Aug. 2, 2022

(54) DISPLAY SCREEN AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Jun Li, Wuhan (CN); Liang Sun, Wuhan (CN)

( * ) Notice: Subject to any disclaimer, the term of this patent is extended or adjusted under 35 U.S.C. 154(b) by 255 days.

(21) Appl. No.: 16/631,460

(22) PCT Filed: Oct. 17, 2019

(86) PCT No.: PCT/CN2019/111631
§ 371 (c)(1),
(2) Date: Jan. 16, 2020

(87) PCT Pub. No.: WO2020/253002
PCT Pub. Date: Dec. 24, 2020

(65) Prior Publication Data
US 2021/0408499 A1  Dec. 30, 2021

(30) Foreign Application Priority Data
Jun. 18, 2019 (CN) .......................... 201910524273.9

(51) Int. Cl.
  H01L 51/52   (2006.01)
  H01L 27/32   (2006.01)
  H04M 1/02    (2006.01)
  H04N 5/225   (2006.01)

(52) U.S. Cl.
  CPC ...... H01L 51/5284 (2013.01); H01L 27/3234 (2013.01); H04M 1/0264 (2013.01); H04M 1/0266 (2013.01); H04N 5/2257 (2013.01)

(58) Field of Classification Search
  CPC ............ H01L 51/5284; H01L 27/3234; H04M 1/0264; H04M 1/0266; H04N 5/2257
  USPC ................................................... 257/40
  See application file for complete search history.

(56) References Cited

U.S. PATENT DOCUMENTS

| 10,937,845 | B2 * | 3/2021 | Wang ................. H01L 27/3246 |
| 2012/0256089 | A1 * | 10/2012 | Kanda ................. G06K 9/0004 |
| | | | 250/338.1 |
| 2017/0242292 | A1 * | 8/2017 | Jeon ................. G02F 1/133502 |
| 2019/0172887 | A1 * | 6/2019 | Sun ..................... H01L 27/3258 |
| 2019/0180073 | A1 | 6/2019 | Zhang et al. |

(Continued)

FOREIGN PATENT DOCUMENTS

| CN | 202475518 U | 10/2012 |
| CN | 107994034 A | 5/2018 |

(Continued)

*Primary Examiner* — David Vu
*Assistant Examiner* — Brandon C Fox

(57) ABSTRACT

The present invention provides a display screen and a display device, and the display screen includes at least one first display region and a second display region located outside the at least one first display region; the at least one first display region includes a substrate disposed in the at least one first display region and a light-shielding layer disposed on the substrate; wherein, the light-shielding layer includes at least one first opening located in a non-pixel region between neighboring pixels, and external light enters the display screen through the at least one first opening.

18 Claims, 3 Drawing Sheets

(56) References Cited

U.S. PATENT DOCUMENTS

2020/0104562 A1* 4/2020 Sung .................... G06K 9/0004
2020/0373372 A1* 11/2020 Chung ................ H01L 27/3272
2021/0117639 A1* 4/2021 Yang .................. G06V 40/1318

FOREIGN PATENT DOCUMENTS

CN  108565280 A  9/2018
CN  108682299 A  10/2018

* cited by examiner

DISPLAY SCREEN AND DISPLAY DEVICE

FIELD OF INVENTION

The present invention is related to the display field, and specifically to a display screen and a display device.

BACKGROUND OF INVENTION

With development of technology and increase in people's requirements for products, full screen products with a high screen-to-body ratio have become an expected development trend of smart phones.

Under-screen cameras are an important technology in a high screen-to-body ratio design. In current display devices, pixels in an under-screen camera region are connected to each other through metal traces, but diffraction is generated when light passes through the metal traces, blurring image of the under-screen camera and reducing imaging quality of a front camera module.

The present invention is based on this technical problem and proposes the following technical solution.

SUMMARY OF INVENTION

The present invention proposes a display screen and a display device to solve the technical problem that imaging quality of front cameras of current display devices are poor.

In order to solve the above problems, technical solutions provided by the present application is as follows:

The present invention provides a display screen including at least one first display region and a second display region located outside the at least one first display region;

wherein the at least one first display region includes a substrate disposed in the at least one first display region and a light-shielding layer disposed on the substrate; and the light-shielding layer includes at least one first opening located in a non-pixel region between neighboring pixels, and external light enters the display screen through the at least one first opening.

In the display screen of the present invention, the light-shielding layer further includes at least one second opening; and any one of the at least one second opening corresponds to at least one of the pixels, and light emitted by the at least one of the pixels enters an external side through the at least one second opening.

In the display screen of the present invention, the at least one first opening is located between at least three neighboring second openings.

In the display screen of the present invention, a shape of the at least one first opening and/or a shape of the at least one second opening is at least one of a circle, a triangle, a square, and a rhombus.

In the display screen of the present invention, a pixel density of the at least one first display region is less than a pixel density of the second display region.

In the display screen of the present invention, in a direction from a center of the at least one first display region to the second display region, a distance between two neighboring pixels is equal.

In the display screen of the present invention, in a direction from a center of the at least one first display region to the second display region, a distance between two neighboring pixels is gradually reduced.

In the display screen of the present invention, the at least one first display region includes a boundary region near the second display region; and a distance between two neighboring pixels in the boundary region is equal to a distance between two neighboring pixels in the second display region.

In the display screen of the present invention, the display screen further includes a color film layer on the substrate; and the light-shielding layer is disposed on the color film layer.

In the display screen of the present invention, a material of the light-shielding layer is one of a black photoresist or a black metal.

In the display screen of the present invention, the at least one first display region is disposed in an array on the display screen; and any two neighboring first display regions have an equal distance.

The present invention further proposes a display device including a display screen, a housing, and a camera module disposed between the display screen and the housing;

wherein the display screen includes at least one first display region and a second display region located outside the at least one first display region;

the at least one first display region includes a substrate disposed in the at least one first display region and a light-shielding layer disposed on the substrate; and the light-shielding layer includes at least one first opening located in a non-pixel region between neighboring pixels, and external light enters the display screen through the at least one first opening.

In the display device of the present invention, the camera module includes at least one light receiving unit;

each of the at least one light receiving unit corresponds to each of the at least one first opening; and the external light enters the at least one first display region through the at least one first opening.

In the display device of the present invention, an orthographic projection of the at least one light receiving unit on the display screen is located in the at least one first display region.

In the display device of the present invention, the camera module further includes a shutter disposed on the at least one light receiving unit;

a surface of the shutter near the display screen is made of a reflective material; and the shutter opens, and the camera module receives the external light entering through the at least one first display region when the camera module receives a capture signal from the display device.

In the display device of the present invention, the light-shielding layer further includes at least one second opening; and any one of the at least one second opening corresponds to at least one of the pixels, and light emitted by the at least one of the pixels enters an external side through the at least one second opening.

In the display device of the present invention, the at least one first opening is located between at least three neighboring second openings.

In the display device of the present invention, a pixel density of the at least one first display region is less than a pixel density of the second display region.

In the display device of the present invention, in a direction from a center of the at least one first display region to the second display region, a distance between two neighboring pixels is equal.

In the display device of the present invention, in a direction from a center of the at least one first display region to the second display region, a distance between two neighboring pixels is gradually reduced.

Beneficial effects: the present invention disposes a light-shielding layer on metal traces in an under-screen camera region to prevent light passing through the metal traces from generating diffraction, and increase imaging quality of an under-screen camera module.

DESCRIPTION OF DRAWINGS

In order to describe technical solutions in the present invention clearly, drawings to be used in the description of embodiments will be described briefly below. Apparently, drawings described below are only for some embodiments of the present invention, and other drawings may be obtained by those skilled in the art based on these drawings without creative efforts.

DETAILED DESCRIPTION OF PREFERRED EMBODIMENTS

Figure 1:
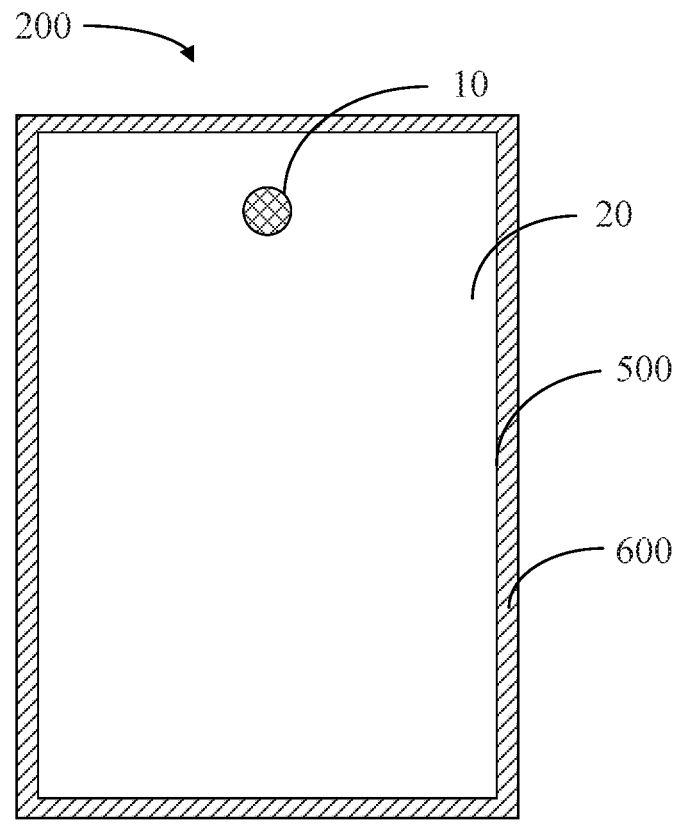
FIG. 1 is a first structural diagram of a display screen of the present invention.

Examples are described below with reference to the appended drawings, and the drawings illustrate particular embodiments in which the present invention may be practiced. Directional terms mentioned in the present invention, such as upper, lower, front, rear, left, right, in, out, side, etc., only refer to directions in the accompanying drawings. Thus, the adoption of directional terms is used to describe and understand the present invention, but not to limit the present invention. In the drawings, units of similar structures are represented using the same numerals.

Referring to FIG. 1, FIG. 1 is a first structural diagram of a display screen of the present invention.

The display screen 200 includes a display region 500 and a non-display region 600. The non-display region 600 is located outside the display region 500. The display region 500 includes at least one first display region 10 and a second display region 20 located outside the at least one first display region 10.

In this embodiment, the display screen 200 includes a first display region 10 and a second display region 20 located outside the first display region 10.

In this embodiment, the first display region 10 can be located in any region of the display screen 200.

The display screen 200 includes a display panel. The display panel in the present invention can be a liquid crystal display panel or an organic light-emitting diode (OLED) display panel, which is not specifically limited in the present invention.

The present invention will be described below by taking the OLED display panel as an example.

The display panel includes a substrate and a light-emitting layer disposed on the substrate.

The light-emitting layer includes a plurality of light-emitting units. Each of the plurality of light-emitting units corresponds to a pixel unit. The pixel unit can be one of a red pixel unit, a green pixel unit, or a blue pixel unit. Three different colors of the pixel units make up a pixel.

Figure 2:
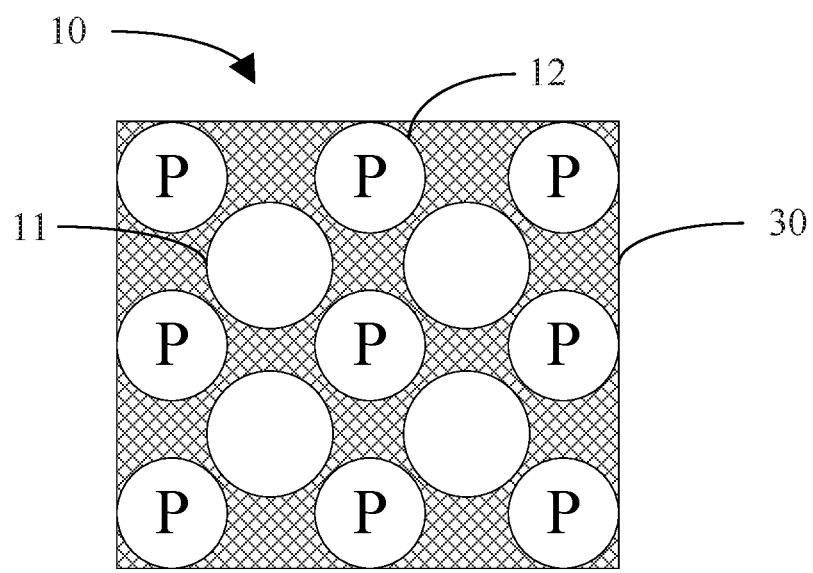
FIG. 2 is a first top view structural diagram of a first display region of the present invention.

Referring to FIG. 2, FIG. 2 is a first top view structural diagram of a first display region of the present invention.

The display screen 200 further includes a light-shielding layer 30 disposed on the substrate.

In this embodiment, an orthographic projection of the light-shielding layer 30 is located in the first display region 10.

In this embodiment, a material of the light-shielding layer 30 is one of a black photoresist or a black metal.

The light-shielding layer 30 includes at least one first opening 11.

The at least one first opening 11 is located in a non-pixel region between neighboring pixels, and external light enters the display screen 200 through the at least one first opening 11.

In this embodiment, a film structure in the at least one first opening 11 is made of a transparent material. For example, a material of the substrate can be transparent polyimide. A material corresponding to an active layer in a thin-film transistor can be indium gallium zinc oxide (IGZO). The thin-film transistor can be provided as an IGZO thin-film transistor. Anodes and cathodes in a light-emitting device layer can use transparent electrodes instead of conventional metal reflective electrodes, and replace a polyimide material which is not completely transparent in a visible light band with a completely transparent substrate material in the visible light band.

A transparent material in the first display region 10 of the present invention is not limited to the above materials.

In this embodiment, a shape of the at least one first opening 11 is at least at least one of a circle, a triangle, a square, and a rhombus.

The light-shielding layer 30 further includes at least one second opening 12.

Wherein, any one of the at least one second opening 12 corresponds to at least one of the pixels, and light emitted by the at least one of the pixels enters an external side through the at least one second opening 12.

In this embodiment, each of the at least one second opening 12 corresponds to one of the pixels.

In this embodiment, an area of the at least one second opening 12 can be less than an area of the at least one first opening 11, and the area of the at least one second opening 12 can also be larger than the area of the at least one first opening 11, it depends on a number of the at least one first opening 11 and the at least one second opening 12.

In this embodiment, a shape of the at least one first opening 11 is at least one of a circle, a triangle, a square, and a rhombus.

In this embodiment, the shape of the at least one first opening 11 can be same as or different from a shape of the at least one second opening 12. A shape of each of the at least one first opening 11 can be same as or different from a shape of each of the at least one second opening 12, and is not specifically limited in the present invention.

In this embodiment, in order to ensure a quality of imaging, each of the shape of each of the at least one first opening 11 are the same.

In this embodiment, the at least one first opening 11 is located between at least three neighboring second openings 12.

Because pixel arrangement structures of different products are different, a shape of the non-pixel region between neighboring pixels can be different.

Referring to FIG. 2, each of the at least one first opening 11 is surrounded by three of the second openings 12.

Figure 3:
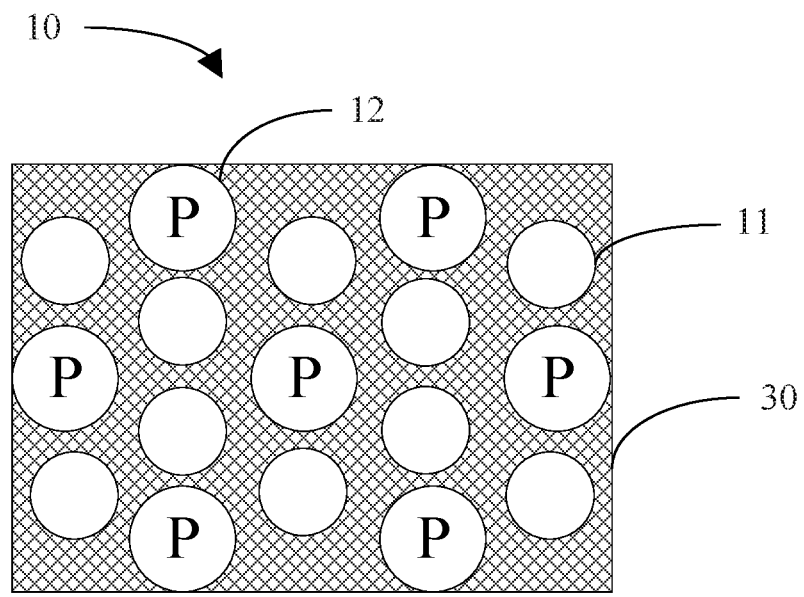
FIG. 3 is a second top view structural diagram of a first display region of the present invention.

Referring to FIG. 3, FIG. 3 is a second top view structural diagram of a first display region of the present invention.

In this embodiment, each of the at least one first opening 11 is surrounded by three of the second openings 12.

In this embodiment, the display screen 200 further includes a color film layer on the substrate. The light-shielding layer 30 is disposed on the color film layer. For example, the light-shielding layer 30 can be disposed on a cover plate layer or under a polarizer layer.

Because metal traces such as data lines or scan lines connect neighboring pixels, diffraction is generated when light passes through the metal traces. Accordingly, the present invention disposes the light-shielding layer 30 on a region that generates the diffraction, disposes the at least one first opening 11 for allowing external light to enter the display screen 200 and the at least one second opening 12 for allowing light emitted by the pixels to enter an external side on the light-shielding layer 30, and the light-shielding layer 30 blocks the metal traces connecting neighboring pixels to prevent metal traces from generating the diffraction.

The first display region 10 in the display screen 200 of the present invention is mainly used for the transmission of the external light, a distance between neighboring pixels in the conventional second display region 20 is short, and a corresponding light receiving unit 401 cannot accurately obtain a corresponding optical signal due to a less amount of the transmission of the external light. Accordingly, the present invention increases a distance between neighboring pixels in the first display region 10 to increase an amount of the external light passing through the at least one first opening 11.

Referring to FIGS. 2 and 3, a pixel density of the first display region 10 is less than a pixel density of the second display region 20.

In this embodiment, in a direction from a center of the first display region 10 to the second display region 20, a distance between two neighboring pixels is equal.

Figure 4:
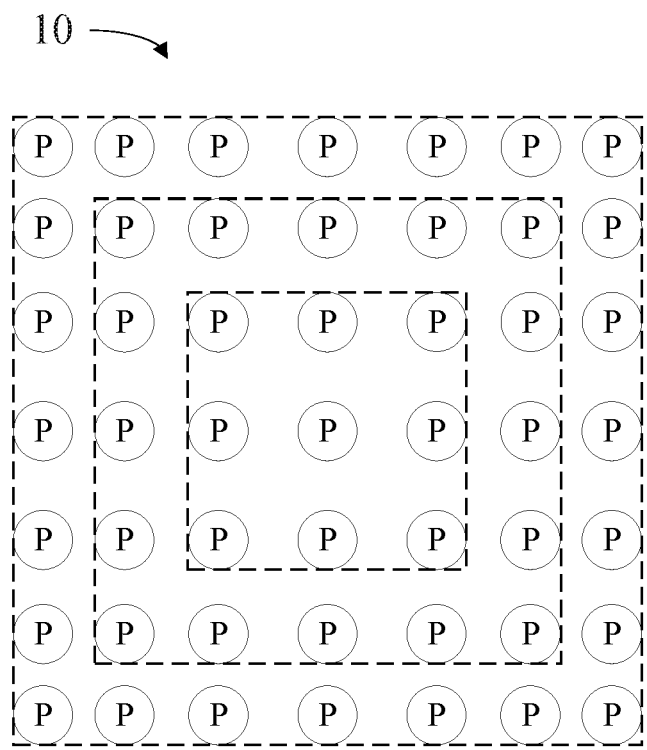
FIG. 4 is a third top view structural diagram of a first display region of the present invention.

Referring to FIG. 4, FIG. 4 is a third top view structural diagram of a first display region of the present invention.

Because the pixel density of the first display region 10 is less than the pixel density of the second display region 20, a resolution of the first display region 10 is less than a resolution of the second display region 20. When the display screen 200 displays an image, users may observe that the image of a partial region is unclear when a sudden change occurs from the second display region 20 to the first display region 10, thereby reducing a user experience.

Accordingly, in the direction from the center of the first display region 10 to the second display region 20, the present invention gradually reduces the distance between two neighboring pixels, so that the resolution of the first display region 10 is gradually reduced, ensuring the user experience.

In this embodiment, the first display region 10 includes a boundary region near the second display region 20. A distance between two neighboring pixels in the boundary region is equal to a distance between two neighboring pixels in the second display region 20.

Figure 5:
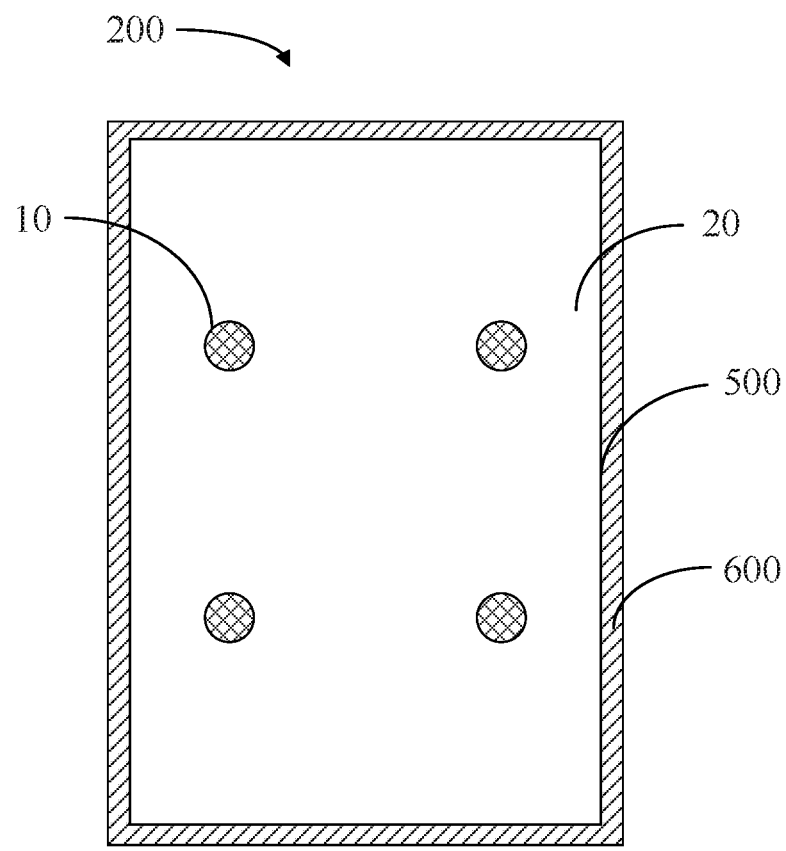
FIG. 5 is a second structural diagram of a display screen of the present invention.

Referring to FIG. 5, FIG. 5 is a second structural diagram of a display screen of the present invention.

The display screen 200 includes a plurality of first display regions 10 and a second display region 20 located outside the plurality of first display regions 10.

In this embodiment, the plurality of first display regions 10 are disposed in an array on the display screen 200, and any two neighboring first display regions 10 have an equal distance.

Comparing to FIG. 1, an area of each of the plurality of first display regions 10 in FIG. 5 is less than an area of the first display region 10 in FIG. 1.

This embodiment divides the first display region 10 in FIG. 1 into the plurality of first display regions 10 in FIG. 5, and makes them evenly distributed on the display screen 200. When a sudden change from the second display region 20 to the plurality of first display regions 10 occurs, because an area of each of the plurality of first display regions 10 in FIG. 5 is small enough, users may not observe a sudden change of resolutions. Therefore, under a premise of ensuring a design of under-screen cameras, user experience is not reduced.

Figure 6:
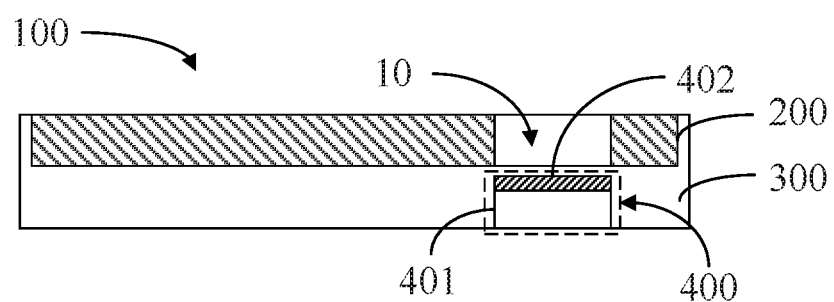
FIG. 6 is a sectional diagram of a display device of the present invention.

Referring to FIG. 6, FIG. 6 is a sectional diagram of a display device of the present invention.

A display device 100 includes the display screen 200 described above, a housing 300, and a camera module 400 disposed between the display screen 200 and the housing 300.

In this embodiment, the camera module 400 can includes a camera.

The camera includes at least one light receiving unit 401.

Each of the at least one light receiving unit 401 corresponds to each of the at least one first opening 11. For example, a number of the at least one light receiving units 401 corresponding to FIG. 1 is one, and a number of the at least one light receiving unit 401 corresponding to FIG. 5 is four.

The at least one light receiving unit 401 of the present invention is mainly used for receiving external light entering from the at least one first opening 11, and transferring an optical signal corresponding to the external light to the camera module 400.

In this embodiment, an orthographic projection of the at least one light receiving unit 401 on the display screen 200 is located in the at least one first display region 10.

The camera module 400 further includes a shutter 402.

In this embodiment, a surface of the shutter 402 near the display screen 200 is made of a reflective material. The present invention reflects the external light entering the at least one first display region 10 through the shutter 402.

In this embodiment, when the camera module 400 is in operation, the shutter 402 of the camera module 400 opens, the external light passes through the at least one first opening 11 of the at least one first display region 10 and enters the at least one light receiving unit 401, and the camera module 400 receives and images the optical signal sent by the at least one light receiving unit 401.

When the camera module 400 is in inoperative state, the shutter 402 of the camera module 400 closes, the external light passes through the at least one first opening 11 of the at least one first display region 10 and enters the display screen 200, and the shutter 402 reflects a corresponding light, which not only improves brightness of the pixels in the first display area 10, but also prevents the external light from causing damage to the camera module 400.

The present invention provides a display screen and a display device, and the display screen includes at least one first display region and a second display region located outside the at least one first display region; the at least one first display region includes a substrate disposed in the at least one first display region and a light-shielding layer disposed on the substrate; wherein, the light-shielding layer includes at least one first opening located in a non-pixel region between neighboring pixels, and external light enters the display screen through the at least one first opening. The present invention disposes a light-shielding layer on metal traces in an under-screen camera region to prevent light passing through the metal traces from generating diffraction, and increase imaging quality of an under-screen camera module.

The foregoing are only preferred embodiments and are not for use in limiting the present invention. Any modification, equivalent replacement, or improvement made without departing from the spirit and principles shall be covered by the protection scope.

What is claimed is:

1. A display screen, comprising:
   at least one first display region; and
   a second display region located outside the at least one first display region;
   wherein the at least one first display region comprises a substrate disposed in the at least one first display region and a light-shielding layer disposed on the substrate;
   the light-shielding layer comprises at least one first opening located in a non-pixel region between neighboring pixels, and external light enters the display screen through the at least one first opening; and
   a pixel density of the at least one first display region is less than a pixel density of the second display region.

2. The display screen as claimed in claim 1, wherein the light-shielding layer further comprises at least one second opening; and
   any one of the at least one second opening corresponds to at least one of the pixels, and light emitted by the at least one of the pixels enters an external side through the at least one second opening.

3. The display screen as claimed in claim 2, wherein the at least one first opening is located between at least three neighboring second openings.

4. The display screen as claimed in claim 2, wherein a shape of the at least one first opening and/or a shape of the at least one second opening is at least one of a circle, a triangle, a square, and a rhombus.

5. The display screen as claimed in claim 1, wherein in a direction from a center of the at least one first display region to the second display region, a distance between two neighboring pixels is equal.

6. The display screen as claimed in claim 1, wherein in a direction from a center of the at least one first display region to the second display region, a distance between two neighboring pixels is gradually reduced.

7. The display screen as claimed in claim 6, wherein the at least one first display region comprises a boundary region near the second display region; and
   a distance between two neighboring pixels in the boundary region is equal to a distance between two neighboring pixels in the second display region.

8. The display screen as claimed in claim 1, wherein the display screen further comprises a color film layer on the substrate; and
   the light-shielding layer is disposed on the color film layer.

9. The display screen as claimed in claim 1, wherein a material of the light-shielding layer is one of a black photoresist or a black metal.

10. The display screen as claimed in claim 1, wherein the at least one first display region is disposed in an array on the display screen; and
    any two neighboring first display regions have an equal distance.

11. A display device, comprising:
    a display screen;
    a housing; and
    a camera module disposed between the display screen and the housing;
    wherein the display screen comprises at least one first display region and a second display region located outside the at least one first display region;
    the at least one first display region comprises a substrate disposed in the at least one first display region and a light-shielding layer disposed on the substrate;
    the light-shielding layer comprises at least one first opening located in a non-pixel region between neighboring pixels, and external light enters the display screen through the at least one first opening; and
    a pixel density of the at least one first display region is less than a pixel density of the second display region.

12. The display device as claimed in claim 11, wherein the camera module comprises at least one light receiving unit;
    each of the at least one light receiving unit corresponds to each of the at least one first opening; and
    the external light enters the at least one first display region through the at least one first opening.

13. The display device as claimed in claim 12, wherein an orthographic projection of the at least one light receiving unit on the display screen is located in the at least one first display region.

14. The display device as claimed in claim 12, wherein the camera module further comprises a shutter disposed on the at least one light receiving unit;
    a surface of the shutter near the display screen is made of a reflective material; and
    the shutter opens, and the camera module receives the external light entering through the at least one first display region when the camera module receives a capture signal from the display device.

15. The display device as claimed in claim 11, wherein the light-shielding layer further comprises at least one second opening; and
    any one of the at least one second opening corresponds to at least one of the pixels, and light emitted by the at least one of the pixels enters an external side through the at least one second opening.

16. The display device as claimed in claim 15, wherein the at least one first opening is located between at least three neighboring second openings.

17. The display device as claimed in claim 11, wherein in a direction from a center of the at least one first display region to the second display region, a distance between two neighboring pixels is equal.

18. The display device as claimed in claim 11, wherein in a direction from a center of the at least one first display region to the second display region, a distance between two neighboring pixels is gradually reduced.

* * * * *